United States Patent
Lin et al.

[11] Patent Number: 6,162,732
[45] Date of Patent: Dec. 19, 2000

[54] METHOD FOR REDUCING CAPACITANCE DEPLETION DURING HEMISPHERICAL GRAIN POLYSILICON SYNTHESIS FOR DRAM

[75] Inventors: Dahcheng Lin, Hsinchu; Chingfu Lin, Taipei, both of Taiwan

[73] Assignee: Taiwan Semiconductor Manufacturing Corp., Hsinchu, Taiwan

[21] Appl. No.: 09/287,959

[22] Filed: Apr. 7, 1999

[51] Int. Cl.[7] .................................................. H01L 21/302
[52] U.S. Cl. ........................ 438/705; 438/255; 438/398; 438/964; 438/719
[58] Field of Search .................... 438/964, 255, 438/398, 705, 719, 723

[56] References Cited

U.S. PATENT DOCUMENTS

| | | | |
|---|---|---|---|
| 5,658,381 | 8/1997 | Thakur et al. | 257/309 |
| 5,885,869 | 3/1999 | Turner et al. | 438/261 |
| 5,886,375 | 3/1999 | Sun | 257/296 |
| 5,933,727 | 8/1999 | Figura | 438/255 |
| 5,937,314 | 8/1999 | Ping et al. | 438/486 |
| 5,963,804 | 10/1999 | Figura et al. | 438/255 |
| 6,004,859 | 12/1999 | Lin | 438/398 |

*Primary Examiner*—Gregory Mills
*Assistant Examiner*—George Goudreau
*Attorney, Agent, or Firm*—Blakely, Sokoloff, Taylor & Zafman LLP

[57] ABSTRACT

A method of forming hemispherical grain (HSG) silicon is disclosed. The method comprises the steps of: forming a doped amorphous silicon layer on a substrate; seeding and annealing the amorphous silicon layer until HSG silicon is formed; enlarging the HSG silicon grains during the annealing stage; and performing a chemical dry etch on the HSG silicon to remove an undoped silicon layer from the surface of the HSG silicon.

4 Claims, 3 Drawing Sheets

METHOD FOR REDUCING CAPACITANCE DEPLETION DURING HEMISPHERICAL GRAIN POLYSILICON SYNTHESIS FOR DRAM

FIELD OF THE INVENTION

This invention relates to semiconductor DRAM memories, and more particularly, to an improved method for forming hemispherical grain polysilicon on a DRAM capacitor.

BACKGROUND OF THE INVENTION

It has been a recent trend in dynamic random access memory (DRAM) to increase the density of DRAM circuits. However, as higher density DRAM cells are developed, the area available for capacitors that are used in the DRAM cells decreases. In order to decrease the area of capacitors while maintaining reliability standards, it is important to be able to maintain the capacitance of each capacitor while decreasing its footprint. Recently, capacitors having a three dimensional structure have been suggested to increase cell capacitance. Such capacitors include, for example, double stacked, fin structured, cylindrical, spread stacked, and box structured capacitors.

One of the most popular methods for increasing the capacitance of a DRAM capacitor is the use of hemispherical grain (HSG) polysilicon. The deposition of HSG polysilicon allows an increase in the surface area of the storage nodes of the capacitor. Typically, HSG polysilicon is formed using a seeding and high vacuum technique. In summary, silane or di-silane is used to seed the surface of the underlying silicon. Next, the HSG polysilicon is formed in a high vacuum. It should be noted that the formation of HSG silicon is a well known technique as exemplified by U.S. Pat. No. 5,837,580 to Thakur et al. See also U.S. Pat. No. 5,639,685 to Zahurak et al.

However, it has been found that when the HSG polysilicon is formed, a thin, undoped silicon layer will be formed on the surface of the HSG. This results in a capacitance depletion effect on the order of 15%. To overcome the effect, a highly doped electrode layer of amorphous silicon must be used in the process. The use of this doped electrode layer will tend to inhibit silicon migration and cause poor HSG growth. Thus, the use of the highly doped amorphous silicon layer is not favorable for HSG formation.

It has also been proposed that a $PH_3$ treatment at 750 degrees Celsius or ion implantation be used to increase the dopant level on the grain surface after the formation of the HSG.

What is needed is a method for reducing the capacitance depletion effect during the synthesis of HSG silicon.

SUMMARY OF THE INVENTION

A method of forming hemispherical grain (HSG) silicon is disclosed. The method comprises the steps of: forming a doped amorphous silicon layer on a substrate; seeding and annealing the amorphous silicon layer until HSG silicon is formed; enlarging the HSG silicon grains during the annealing stage; and performing a chemical dry etch on the HSG silicon to remove an undoped silicon layer from the surface of the HSG silicon.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
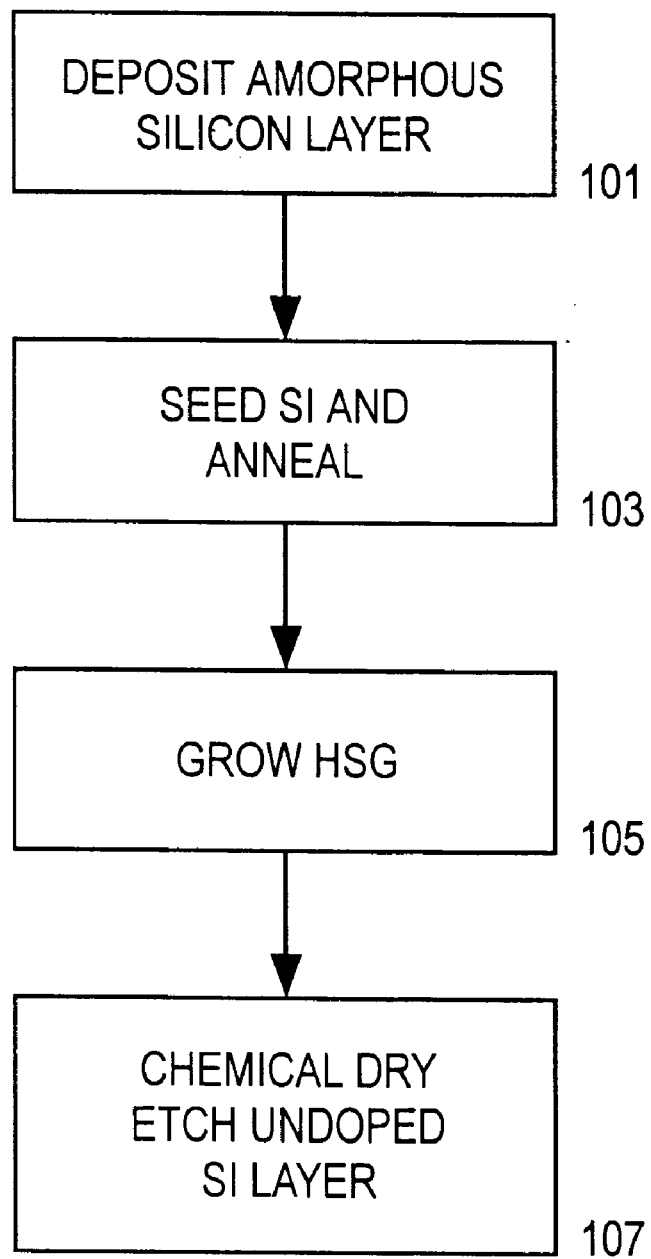
FIG. 1 is a flow diagram illustrating the method of the present invention.
Figure 2:
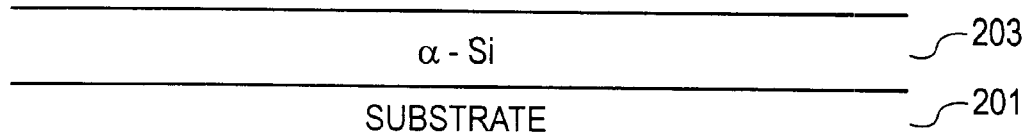
FIGS. 2–5 are schematic cross sections of an amorphous silicon layer showing the formation of the HSG in accordance with the method of the present invention.
Figure 3:
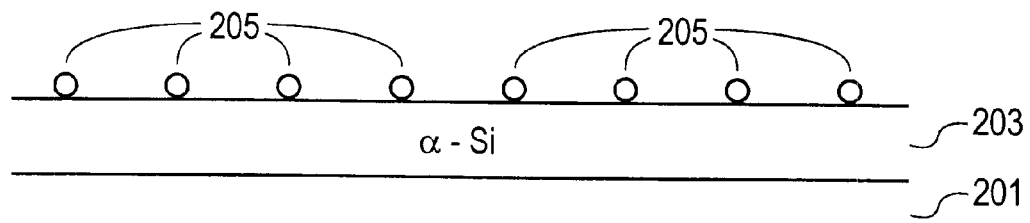
Figure 4:
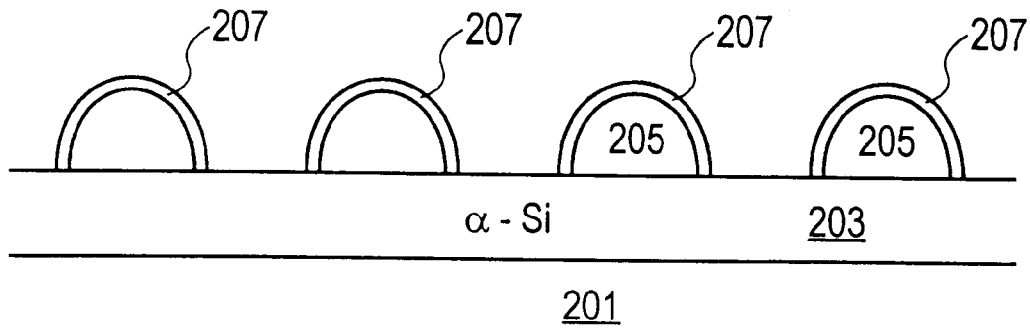

Turning to FIG. 1, the method of the present invention comprises four main steps in forming the HSG polysilicon. First, at step 101, a layer of in-situ doped amorphous silicon 203 (see FIG. 2) is deposited onto a substrate 201. The substrate may be, for example, doped polysilicon. Typically, the deposition temperature is approximately 520° C. Next, referring to FIGS. 1 and 3, seeding elements 205 are formed onto the surface of the amorphous silicon layer 203. This is followed by an annealing treatment at preferably between 550° C. and 620° C. Next, at step 105 and FIG. 4, because of silicon migration, HSG structures are formed during the annealing stage. The length of the annealing time is proportional to the size of the HSG grains. As the annealing time lengthens, the size of the HSG grains increase.

Figure 5:
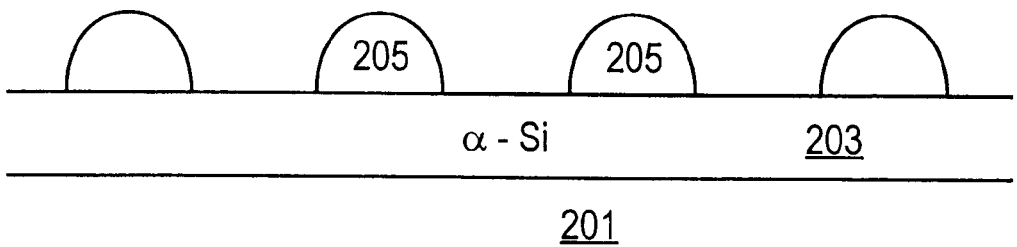

Unfortunately, as noted above, capacitance depletion occurs because of a thin, undoped silicon layer 207 that forms on the surface of the HSG structures. The capacitance depletion may be negligible for 0.25 micron DRAM products because the cell size with the HSG area gain may be large enough to overcome the loss. However, the capacitance loss becomes a critical issue when devices are scaled down to 0.21 or 0.18 micron. Thus, in FIG. 1 and in FIG. 5, the method of the present invention further includes step 107, which is a chemical dry etch of the undoped silicon layer 207. The chemical dry etch process is used to etch out the undoped silicon layer (approximately a few tens of angstroms) after the HSG growth. The chemical dry etching process is an isotropic etch in which the etching species are decomposed into free radicals, rather than ions for a reactive ion etch. The preferred CDE process uses halogen based etching gases, such as $CF_4$, $SF_6$, $CHF_3$, and $O_2$, to slowly and smoothly remove the undoped HSG surface. Because portions of the HSG grains 205 are lost, the HSG grain should be initially formed to a larger size. It should also be noted that the CDE process will also smooth the HSG surface, leading to increased reliability. Additionally, a $PH_3$ treatment at 750 degrees Celsius or ion implantation be used to increase the dopant level on the grain surface after the formation of the HSG.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming hemispherical grain (HSG) silicon comprising the steps of:

forming a doped amorphous silicon layer on a substrate;

seeding and annealing said amorphous silicon layer until HSG silicon grains are formed;

enlarging said HSG silicon grains during the annealing stage;

performing a chemical dry etch on said HSG silicon to remove an undoped silicon layer from the surface of said HSG silicon.

2. The method of claim 1 further including the step of performing a $PH_3$ treatment at about 750 degrees Celsius to increase the dopant concentration of said HSG silicon grains.

3. The method of claim 1 further including the step of performing an ion implantation step to increase the dopant concentration of said HSG silicon grains.

4. The method of claim 1 wherein said chemical dry etch uses a halogen based etching gas.

* * * * *